(12) United States Patent
Sim

(10) Patent No.: US 6,473,348 B2
(45) Date of Patent: Oct. 29, 2002

(54) DATA SENSING CIRCUIT OF SEMICONDUCTOR MEMORY

(75) Inventor: Jae-Yoon Sim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/899,637

(22) Filed: Jul. 5, 2001

(65) Prior Publication Data

US 2002/0057622 A1 May 16, 2002

(30) Foreign Application Priority Data

Nov. 10, 2000 (KR) .............................. 00-66805

(51) Int. Cl.[7] ................................................ G11C 7/00
(52) U.S. Cl. ..................... 365/205; 365/202; 365/207
(58) Field of Search ............................ 365/230.03, 202, 365/203, 205, 207

(56) References Cited

U.S. PATENT DOCUMENTS

| | | | | |
|---|---|---|---|---|
| 5,243,574 A | * | 9/1993 | Ikeda | 365/207 |
| 5,689,461 A | * | 11/1997 | Kaneko et al. | 365/189.11 |
| 6,097,652 A | * | 8/2000 | Roh | 365/205 |
| 6,285,612 B1 | * | 9/2001 | DeBrosse | 365/205 |

* cited by examiner

*Primary Examiner*—Richard Elms
*Assistant Examiner*—Hien Nguyen
(74) *Attorney, Agent, or Firm*—F. Chau & Associates, LLP

(57) ABSTRACT

A semiconductor memory device for performing an effective data sensing operation with a simple constitution. The device comprises first and second blocks each disposed about a sense amplifier and formed of a plurality of bitlines; a circuit for connecting a bitline coupled to memory cell of the first block and a complementary bitline of the second block to the sense amplifier, and charging a bitline coupled to memory cell of the second block and a complementary bitline of the first block up to a predetermined voltage, in response to a signal.

18 Claims, 8 Drawing Sheets

DATA SENSING CIRCUIT OF SEMICONDUCTOR MEMORY

This application claims priority upon Korean Patent Application No. 200066805, filed Nov. 10, 2000, the contents of which are incorporated by reference herein in their entirety.

FIELD OF THE INVENTION

This invention relates generally to dynamic random access memory devices, and more particularly to a memory cell core circuit that is activated when sensing memory cell data on bitlines.

BACKGROUND OF THE INVENTION

The greater the density of dynamic random access memory (DRAM), the greater the problems relevant to densely packed data transmission lines (e.g., bitlines). In general, an operation for sensing data stored in a memory cell begins by activating a pass transistor that is coupled to a selected wordline. Then, charges are transferred to the bitlines coupled to the memory cell, which is called "charge sharing". A sense amplifier assigned in the bitline amplifies the voltage difference between the selected bitline and the complement thereof and transfers the signal to an input/output line as an amplified data signal. The data sensing path and memory cell as a unit is a first data sensing circuit, which is called a memory cell core circuit. FIG. 1 shows a general memory cell core circuit.

As shown in FIG. 1, a plurality of memory cells MC are connected to a bitline pair BLi/BLBi (or BLj/BLBj) in which isolation transistor pairs N1/N2 and N3/N4 are disposed therein. A sense amplifier SA is disposed between the isolation transistor pairs N1/N2 and N3/N4 and connected to the bitline pairs BLi/BLBi and BLj/BLBj to which bitline precharge/equalization circuits PQi and PQj, respectively comprising NMOS transistor pairs N5/N6 and N7/N8, are connected.

A data sensing operation of the memory cell core circuit of FIG. 1 is now explained with reference to FIGS. 1 through 3. Assuming an $i^{th}$ block is selected, an isolation signal ISOi applied to gates of the isolation transistor pair N1/N2 in the $i^{th}$ block goes high, and an isolation signal ISOj applied to gates of the isolation transistor pair N3/N4 in the $j^{th}$ block goes low. The bitlines BLi/BLBi in the $i^{th}$ block will be precharged and equalized to a bitline precharge/equalization voltage VBL when equalization signal EQi is brought high. When the equalization is then brought down low, when a wordline WLiO is selected charge sharing between the memory cell MC and bitline BLi is established in response to the data held in the memory cell MC. At that time, the bitline BLBi is precharged up to an initial precharge voltage VBL. The sense amplifier SA amplifies a minute potential difference between bitlines BLi and BLBi in response to a sense amplifier control signal SAE being brought high.

The voltage difference between the bitlines BLi and BLBi generated by the charge sharing is at least capable of inducing a triggering of the sense amplifier SA, in order to accomplish a reliable sense amplification operation of the sense amplifier SA. However, there is mutual capacitance (or coupling capacitance) because the bitline pair BLi/BLBi being activated are parallel and spaced closely enough together on the semiconductor wafer to establish capacitance between them. Assuming that a selected memory cell stores a logical "1" bit data and the voltage rise from the primary voltage on the bitline BLi by the charge sharing is V, the voltage of the bitline BLi before the sense amplification operation in the sense amplifier SA is VBL+V. Here, the bitline BLBi, theoretically, would maintain VBL of the precharge/equalization level, but substantially becomes about VBL+0.2(VBL+V) because of the mutual capacitance. As a result, such a decrease of the potential difference between the bitlines BLi and BLBi causes an amplifying operation in the sense amplifier SA to be under-performed.

To mitigate capacitive losses in sense amplification operations, a method of synchronously arranging bitlines in an open bitline architecture into a twisted architecture is disclosed in U.S. Pat. No. 5,383,159 and Japanese publication No. 61-255591. For example, in the U.S. Pat. No. 5,383,159, the bitlines of the bitline pairs that are synchronously activated are arranged in opposite directions of each other. While a bitline pair (e.g., BLi/BLBj of FIG. 1) is activated, the other bitline pair (e.g., BLj/BLBi) in the opposite direction is precharged/equalized to the bitline voltage (e.g.,VBL) by an equalization signal. Thereby, the mutual capacitance between bitlines can be suppressed. However, it becomes necessary to control the connecting states of precharge/equalization transistors and the timing of the equalization signal in order for the precharging and equalization operations of the bitlines to be controlled.

Because of the greater densities and speeds of state-of-the art DRAM, there is little time for an activation/inactivation of signals to control the sensing operations and timing between read and write signals. Thus, there is a need to address the capacitance problem.

SUMMARY OF THE INVENTION

It is therefore an object of the invention to provide a device capable of performing an effective data sensing operation in a high-integrated dynamic random access memory (DRAM).

It is another object of the invention to provide a constitution of a memory cell core circuit profitable for the high-integrated architecture, reducing mutual capacitance (or coupling capacitance) between bitline pair in DRAM.

It is still another object of the invention to provide a device capable of performing a reliable data sensing operation without employing an additional signal for precharging and equalizing bitlines in DRAM.

In order to attain the above objects, according to an aspect of the invention, there is provided a DRAM, situating each of bitlines of bitline pair that is synchronously activated in different blocks, and precharging the bitlines in response to an isolation signal which controls a connection between the bitline and the sense amplifier. Thus, it is not necessary to use an additional signal for precharging and equalizing the bitlines.

According to an aspect of the invention, there is provided a semiconductor memory device includes: a first and second blocks each disposed in sides of a sense amplifier, and formed of a plurality of bitlines; a circuit connecting a bitline coupled to memory cell of the first block and a complementary bitline of the second block to the sense amplifier, and charging a bitline coupled to memory cell of the second block and a complementary bitline of the first block up to a predetermined voltage in response to a signal.

According to another aspect of this invention, there is provided a semiconductor memory device including an isolation transistor connecting a bitline to a sense amplifier, and a precharge transistor connecting the bitline to reference voltage. In the device, a conductive line extends to a certain direction for transferring a signal for controlling the isolation and precharge transistors. A lower portion of the conductive line has a conductive active region of the isolation transistor and a conductive active region of the precharge transistor as a gate therein.

The invention will be better understood from the following detailed description of the exemplary embodiment thereof taken in conjunction with the accompanying drawings, and its scope will be pointed out in the appended claims.

DESCRIPTION OF PREFERRED EMBODIMENTS

Figure 4:
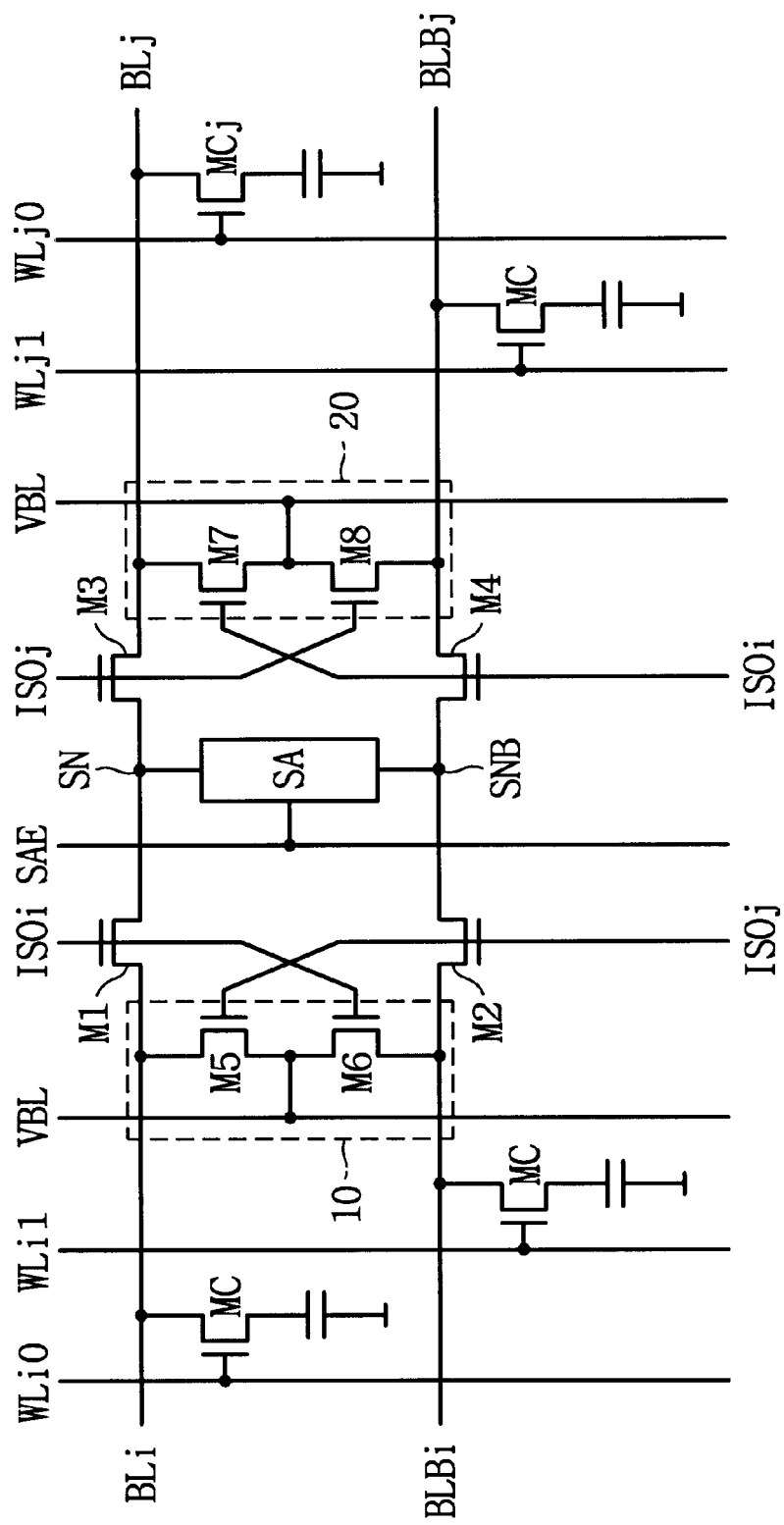
FIG. 4 is a circuit diagram showing a memory cell core according to an embodiment of the invention.

Referring to FIG. 4, there is shown a precharge circuit 10 having n-channel metal oxide semiconductor (NMOS) transistors M5 and M6 connected in series between bitline pair BLi/BLBi of an $i^{th}$ block, and a precharge circuit 20 comprising NMOS transistors M7 and M8 connected in series between bitline pair BLj/BLBj of a $j^{th}$ block. An isolation transistor M1 is connected between the bitline BLi and a sensing node SN, and an isolation transistor M3 is connected between the sensing node SN and the bitline BLj. An isolation transistor M2 is connected between the bitline BLBi and a sensing node SNB, and an isolation transistor M4 is connected between the bitline BLBj and the sensing node SNB.

Figure 1:
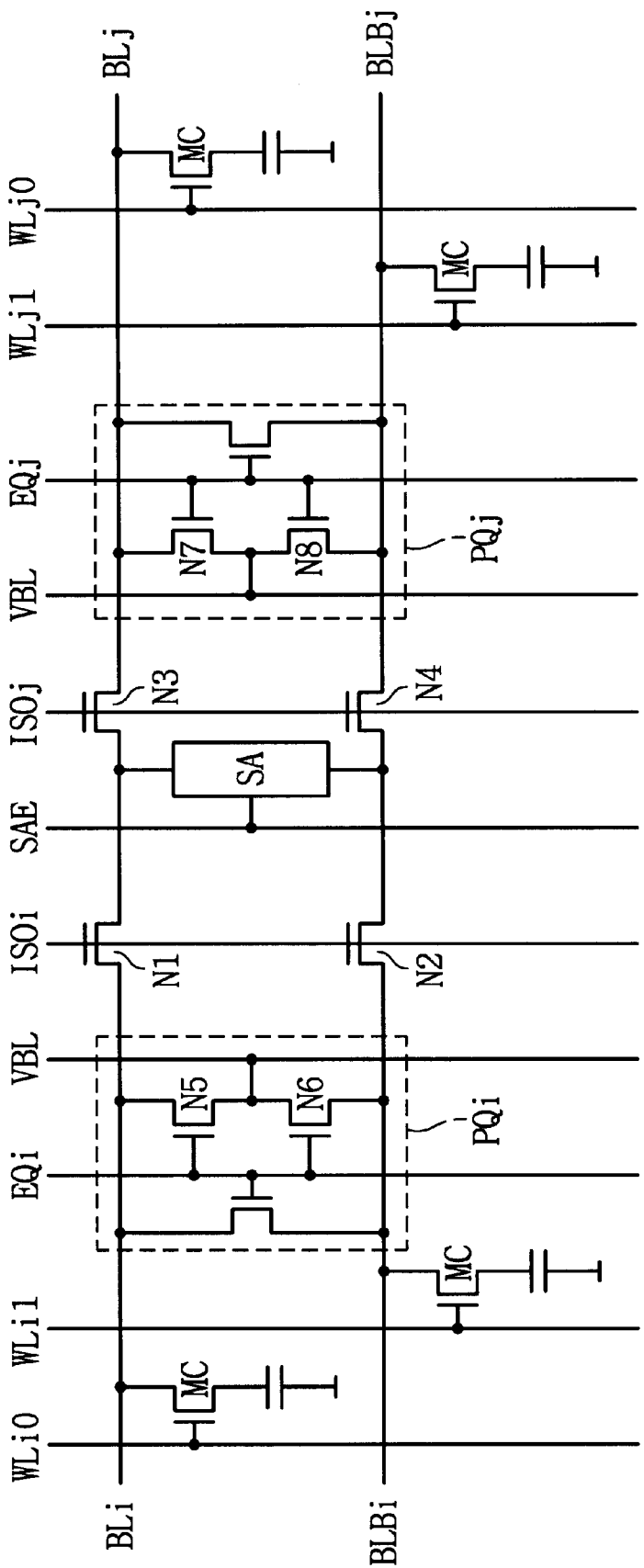
FIG. 1 is a circuit diagram showing a conventional memory cell core.
Figure 2:
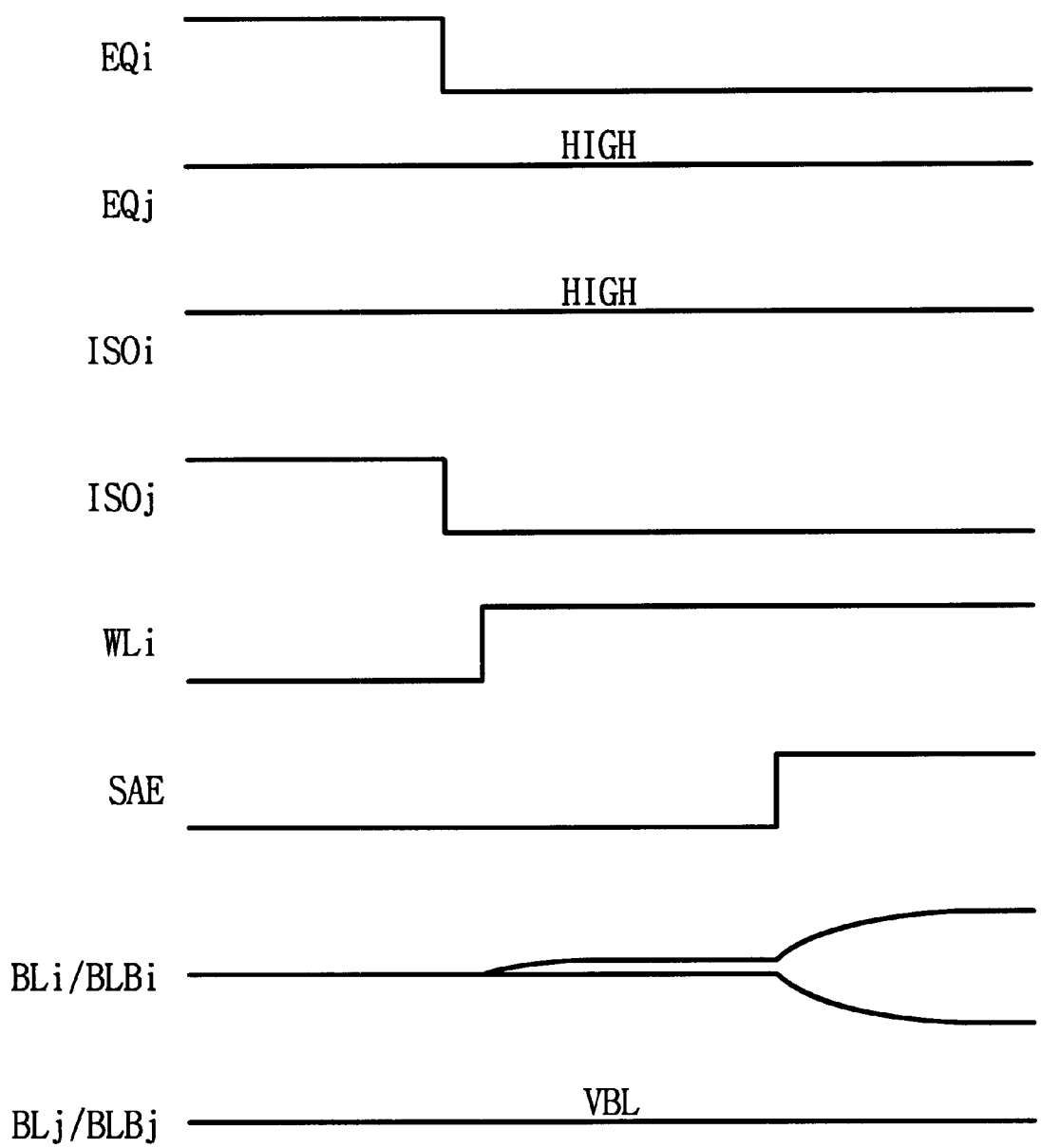
FIG. 2 is a timing diagram showing a conventional data sensing operation of the memory cell core shown in FIG. 1.
Figure 3:
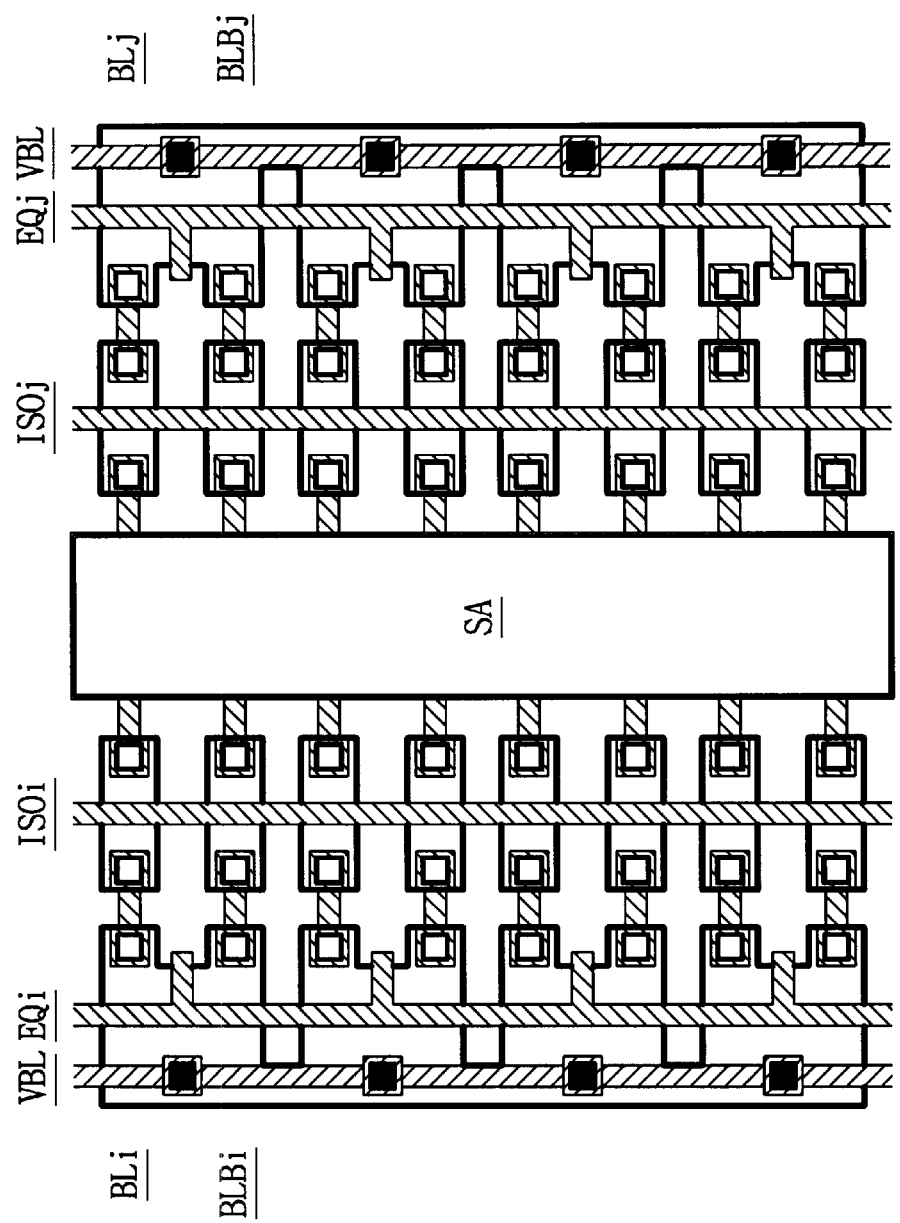
FIG. 3 is a schematic diagram of a conventional layout pattern of the memory cell core circuit shown in FIG. 1.

The connections of sources and drains of the isolation transistors and the precharge transistors are identical with the conventional circuit of FIG. 1, but the connection of gates of the precharge circuit transistors is quite different. Note that the gates of the precharge transistors M6 and M7 are commonly connected to isolation signal ISOi and that isolation signal ISOi also controls the gates of the isolation transistors M1 and M4. Likewise, the gates of the precharge transistors M5 and M8 are commonly connected to isolation signal ISOj and with gates of the isolation transistors M2 and M3. The circuit therefore permits precharging of the bitlines with a single isolation signal ISOi (or ISOj), without employing an additional precharge signal as the prior art shown in FIG. 1 requires.

Figure 5:
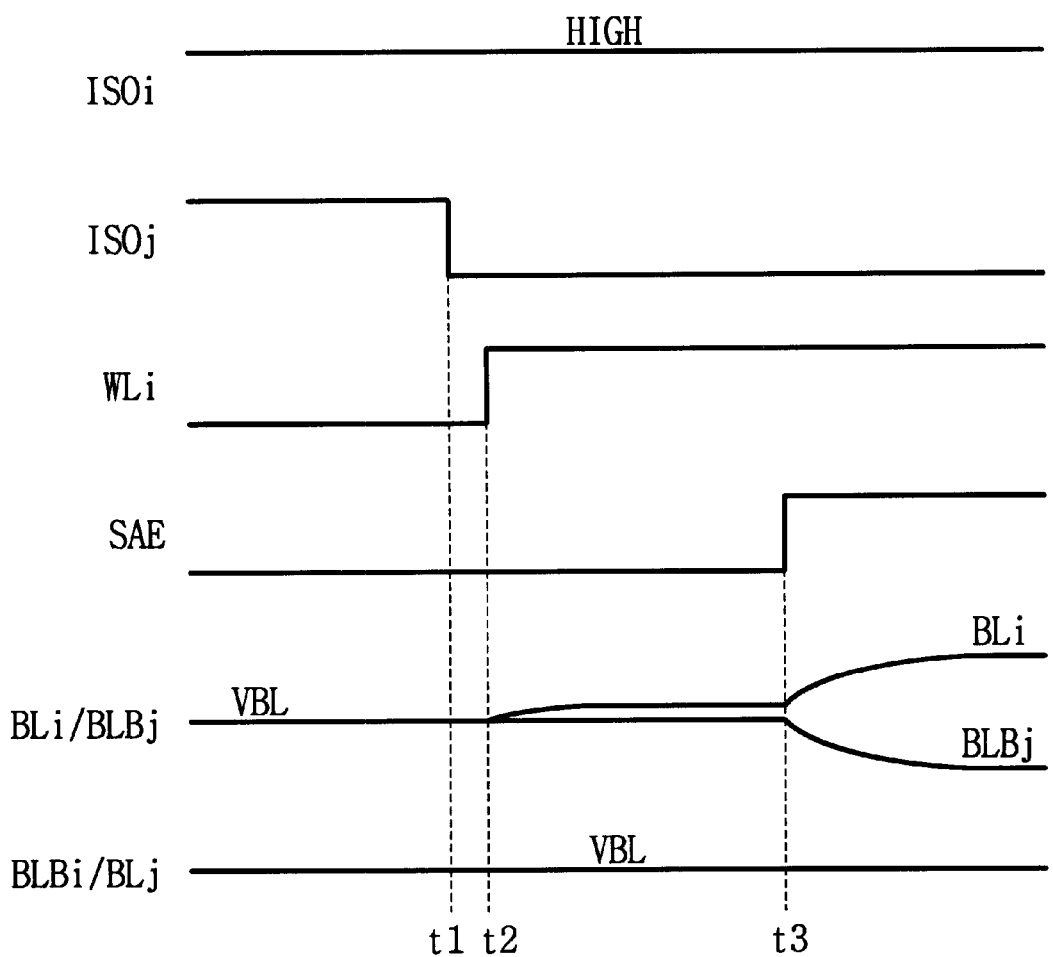
FIG. 5 is a timing diagram showing a data sensing operation of the memory cell core shown FIG. 4.

FIG. 5 is a timing diagram showing the data sensing operations of the inventive memory cell core of FIG. 4. Assuming that the $i^{th}$ block is selected, the isolation signal ISOi in the $i^{th}$ block is high during the entire sensing operation and the isolation signal ISOj in the $j^{th}$ block transitions high to low at time t1. The transistors M5 through M8 of the precharge circuits 10 and 20 are turned on up until time t1 and the bitline pairs BLi/BLBi and BLj/BLBj are charged up to precharge voltage VBL. After the time t1, the isolation signal ISOj in the $j^{th}$ block goes low, thereby shutting off isolation transistors M2 and M3 and precharge transistors M5 and M8. At that time, the isolation transistors M1 and M4 respectively are already connecting the bitlines BLi and BLBj to the sense amplifier SA because the isolation signal ISOi remains high throughout the sensing operation. Thereafter, when any selected wordline WLi is brought high, such as is shown at time t2, charge sharing between the selected memory cell MCi and the bitline BLi is established, and the bitline BLBj is charged up to the reference voltage, which is the same as the precharge voltage VBL. At time t3, the sense amplifier control signal SAE is brought high and causes the sense amplifier SA to amplify the potential difference between the bitlines BLi and BLBj. Notice that the invention is measuring the difference between two bitlines that are not side-by-side and therefore can have no substantial capacitance between them.

Figure 8:
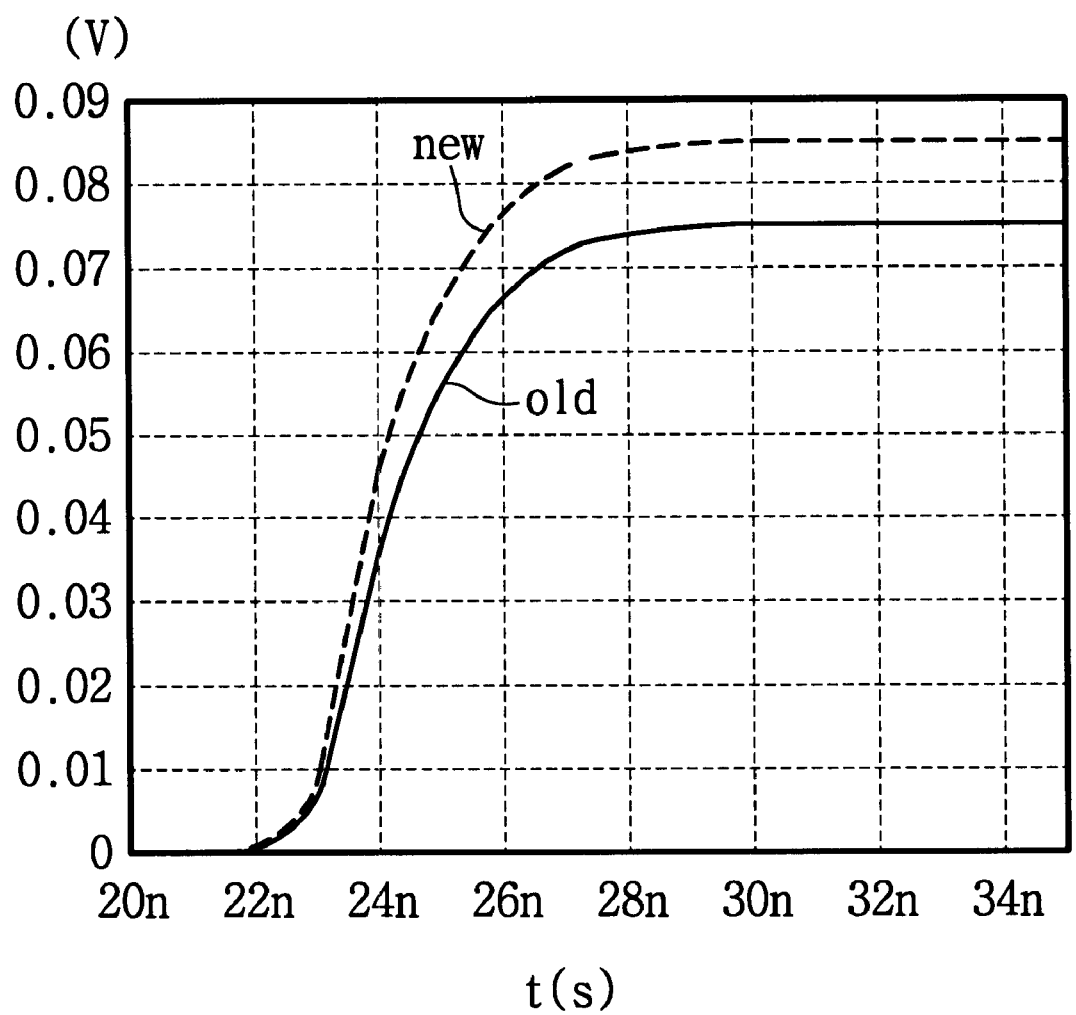
FIG. 8 is a graph showing a voltage difference between the conventional art and the invention.

Referring to FIG. 8, the result of the sense operation is shown. FIG. 8 shows a potential difference between bitlines beginning at when charge sharing is established until the sense amplifier is turned on (i.e., it shows the voltage difference between the bitlines in a sensing operation from time t2 to time t3). As shown in FIG. 8, the potential difference between bitlines of the invention (the line labeled "new") is larger than that of the prior art ("old") by about 0.01 V. The result is similar to the conventional manner in which bitlines are simultaneously arranged in a twisted architecture, but it is a remarkable feature of the invention that the result arises from using an isolation signal without employing an additional separate signal for precharging and equalizing the bitline. Improved performance is surprisingly achieved by eliminating certain components.

Likewise, if the $j^{th}$ block is selected, the isolation signal ISOj remains high throughout the sensing operation such that both bitlines BLi and BLBj are charged up to the precharge voltage VBL. After the isolation signal ISOi goes low at time t1, any wordline WLj brought high at time t2 will generate a minute potential difference between the bitlines BLBi and BLj, which may then be amplified by the sense amplifier SA.

Figure 6:
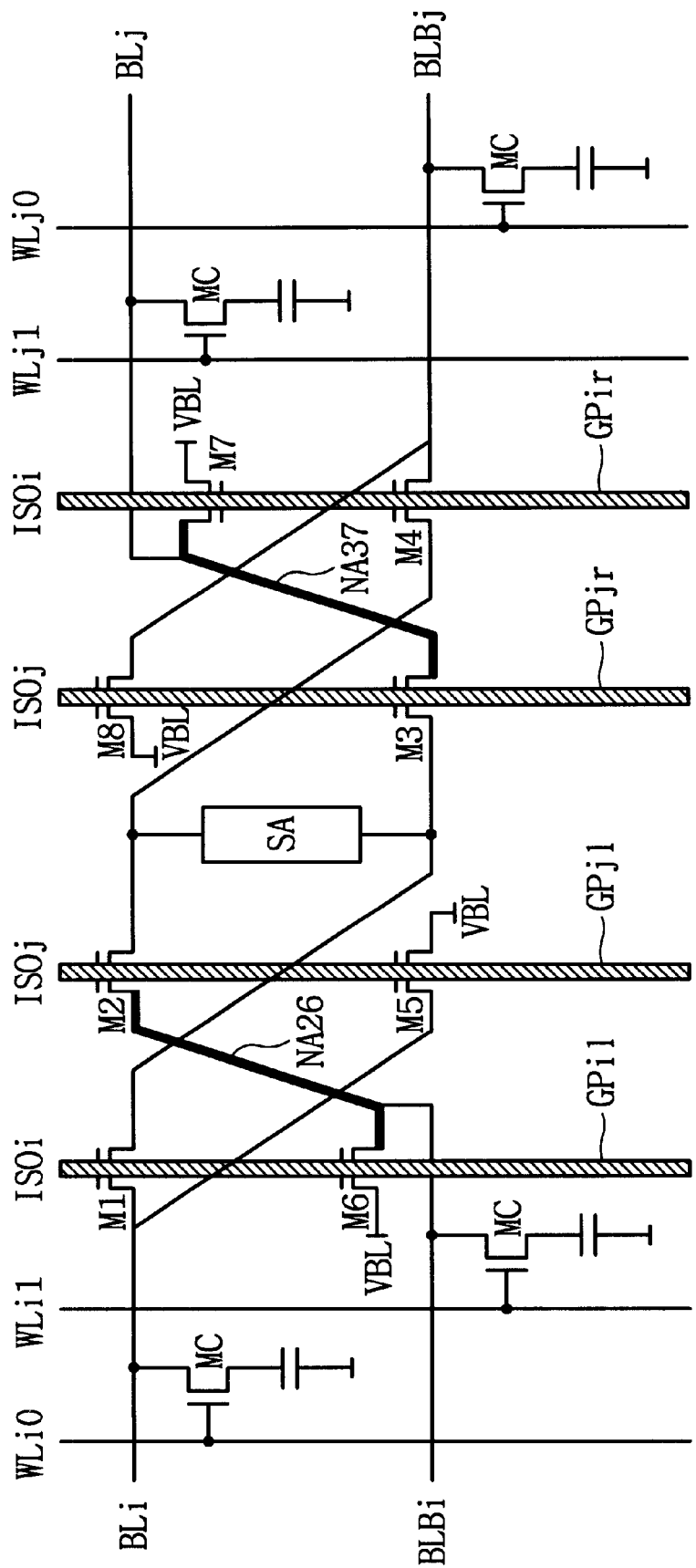
FIG. 6 is a schematic diagram showing an interconnection arrangement of bitlines of FIG. 4.
Figure 7:
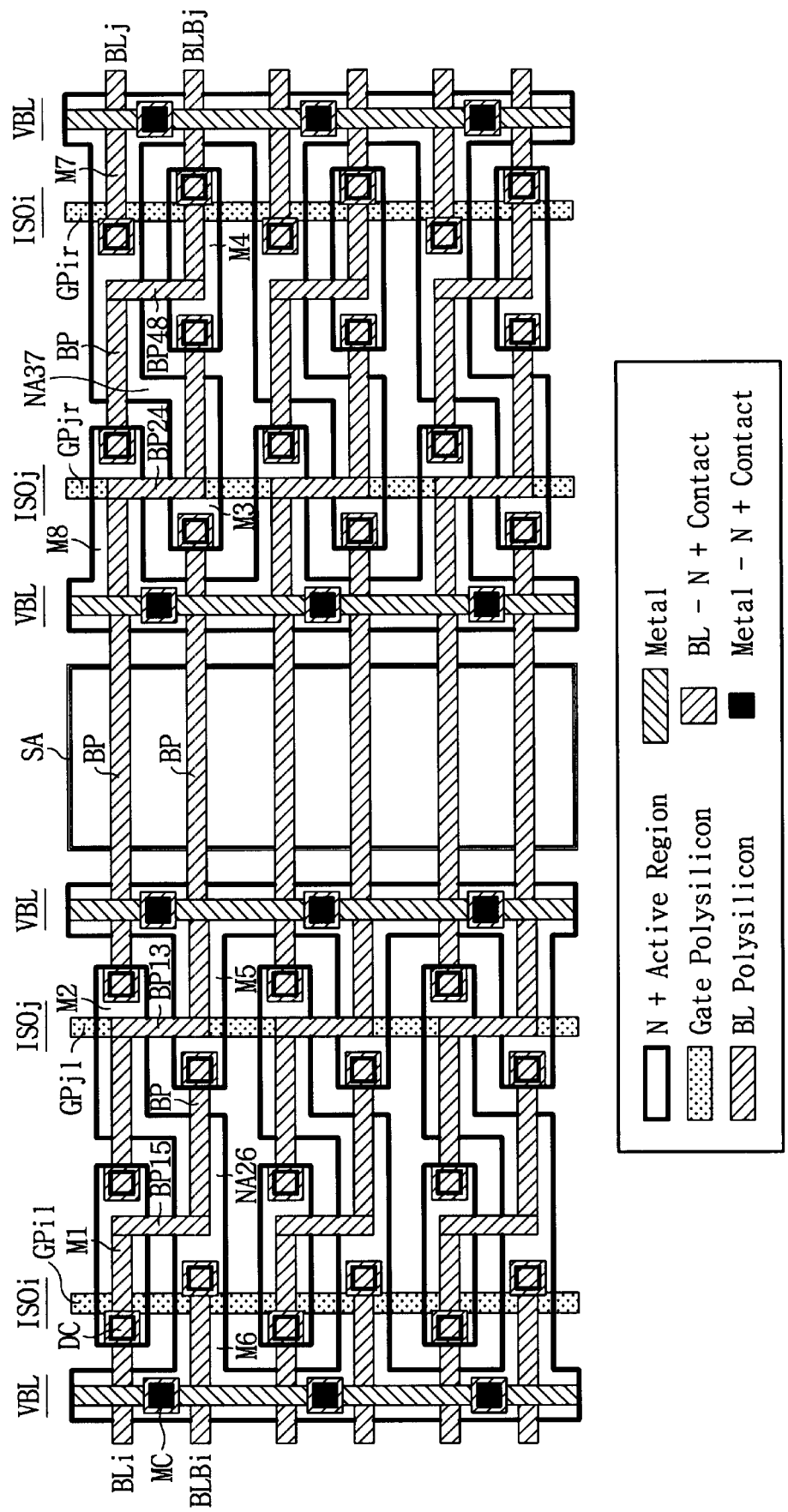
FIG. 7 is a schematic diagram of a layout pattern of the cell core circuit shown in FIG. 4.

Referring to FIGS. 6 and 7, FIG. 6 schematically shows a methodological embodiment of the invention, while FIG. 7 shows a practical layout pattern in accordance with FIG. 6 and shows patterns of bitlines, isolation transistors, and precharge transistors around the sense amplifier region SA. Although the lines for the isolation signal ISOi and ISOj are shown to be crossing each other in FIG. 4, in actuality gate polysilicon layers for the isolation signal lines will generally be formed on the same vertical level in the same manufacturing step because of the difficulty of crossing the isolation signal lines for the gate polysilicon layers.

As shown in FIGS. 6 and 7, gate polysilicon layers GPi1, GPj1, GPjr, and GPir for carrying the isolation signals ISOi and ISOj are straight and uncrossed. The N+ active regions of the isolation transistors M1, M2, M3, and M4 and the precharge transistors M5, M6, M7, and M8 are formed under each side of the gate polysilicon layers so as to generate the circuit of FIG. 4 without crossover. The gate polysilicon layer for the isolation signal ISOi of the $i^{th}$ block is divided into GPil and GPir on either side of the region of the sense amplifier SA, and gate polysilicon layer for the isolation signal ISOj of the $j^{th}$ block is divided into GPj1 and GPjr on either side of the region of the sense amplifier SA. In the sense amplifier region SA, even though not shown, there are not only bitline sense amplifiers, but also input/output gate transistors for connecting the bitline with input/output line.

The active regions of the isolation and precharge transistors may be formed under each side of the gate polysilicon layers. In the embodiment shown, the N+ active regions of the isolation transistor M1 and the precharge/equalization transistor M6 are respectively formed on the separate places under each side of the gate polysilicon layer GPi1. N+ active regions of the isolation transistor M2 and the precharge/equalization transistor M5 are respectively formed on separate places under each side of the gate polysilicon layer GPj1. Further, N+ active regions of the isolation transistor M3 and the precharge transistor M8 are respectively formed on separate places under each side of the gate polysilicon layer GPir. N+ active regions of the isolation transistor M4 and the precharge transistor M7 are respectively formed on separate places under each side of the gate polysilicon layer GPjr.

The active regions of the isolation transistor M2 and the precharge transistor M6 are connected to each other through an extended active region NA26, and the active regions of the isolation transistor M1 and the precharge transistor M5 are connected to each other through a bridge polysilicon layer BP15. The active regions of the isolation transistor M2 and the precharge transistor M4 are connected to each other through a bridge polysilicon layer BP24, and the active regions of the isolation transistor M1 and the isolation transistor M3 are connected to each other through a bridge polysilicon layer BP13. The active regions of the isolation transistor M3 and the precharge transistor M7 are connected to each other through the extended active region NA37, and the active regions of the isolation transistor M4 and the precharge transistor M8 are connected to each other through a bridge polysilicon layer BP48.

The connections of the precharge/equalization transistors with the bitline precharge voltage VBL are identical with the prior art.

The bridge polysilicon layers BP15, BP13, BP24 and BP48 may be formed with the bitline polysilicon layer BP in a single manufacturing operation using a single mask so as to connect the active regions of the transistors, which are not connected as an active pattern. Thus, it is not necessary to form the bridge polysilicon layer in an additional step. According to the layout arrangement shown in FIGS. 6 and 7, the active regions of M2 (or M3) and M6 (or M7) are connected through an extended active region, and the active regions of M1 (or M3) and M4 (or M8) are connected through the bridge polysilicon layer. However, one could just as well fabricate the circuit such that that the active regions of M2 (or M3) and M6 (or M7) are connected through the bridge polysilicon layer, and the active regions of M1 (or M3) and M4 (or M8) are connected through the extended active region.

Accordingly to the forgoing description, there is provided a memory cell core circuit in which parasitic capacitance between bitlines is eliminated during sensing operations without need of complex circuitry, and in which the circuitry is actually simplified and made more efficient by the elimination of excess signal control lines.

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A semiconductor memory device, comprising:
   a first and second block each comprising one or more bitlines;
   a sense amplifier; and
   a logic means for connecting a bitline connected to a memory cell of the first block to a complementary bitline of the second block in response to a first control signal, and isolating a bitline connected to a memory cell of the second block and a complementary bitline of the first block from the sense amplifier in response to a second control signal,
   wherein a first isolation means connected to the bitline of the first block and a first precharge means connected to the complementary bitline of the first block are synchronously controlled by the first control signal.

2. The semiconductor memory device of claim 1, wherein a second precharge means connected to the bitline of the second block and a second isolation means connected to the complementary bitline of the second block are controlled by the first control signal.

3. The semiconductor memory device of claim 2, further comprising:
   a third precharge means connected to the bitline of the first block;
   a third isolation means connected to the complementary bitline of the first block; and
   wherein said third precharge and isolation means controlled by the second control signal.

4. The semiconductor memory device of claim 3, further comprising:
   a fourth isolation means connected to the bitline of the second block;
   a fourth precharge means connected to the complementary bitline of the second block; and
   wherein said fourth isolation and precharge means are synchronously controlled by the second control signal.

5. The semiconductor memory device of claim 3, wherein a first end of the first isolation means is coupled with a first end of the third precharge means, and a second end of the first isolation means is coupled with a first end of the sense amplifier.

6. The semiconductor memory device of claim 3, wherein a first end of the third isolation means is coupled with a first end of the first precharge means.

7. The semiconductor memory device of claim 4, wherein a first end of the second isolation means is coupled with a second end of the third isolation means, and a second end of the second isolation means is coupled with a first end of the fourth precharge means.

8. The semiconductor memory device of claim 4, wherein the first end of the second isolation means is coupled with a second end of the sense amplifier.

9. The semiconductor memory device of claim 4, wherein a first end of the fourth isolation means is coupled with a first end of the second precharge means, with the first end of the sense amplifier, and with the second end of the first isolation means.

10. A semiconductor memory device, comprising:

a first and second block each comprising one or more bitlines;

a sense amplifier;

a first logic means for connecting a bitline connected to a memory cell of the first block and a complementary bitline of the second block to the sense amplifier in response to a first control signal;

a second logic means for connecting a bitline connected to a memory cell of the second block and a complementary bitline of the first block to the sense amplifier in response to a second control signal;

wherein a first isolation means connected to the bitline of the first block and a first precharge means connected to the complementary bitline of the first block are controlled by the first control signal, and a third isolation means connected to the complementary bitline of the first block and a third precharge means connected to the bitline of the first block are controlled by the second control signal.

11. The semiconductor memory device of claim 10, wherein a second precharge means connected to the bitline of the second block and a second isolation means connected to the complementary bitline of the second block are controlled by the first control signal, and a fourth precharge means connected to the complementary bitline of the second block and a fourth isolation means connected to the bitline of the second block are controlled by the second control signal.

12. The semiconductor memory device of claim 10, wherein a first end of the first isolation means of the first block is coupled with a first end of the sense amplifier through a first coupling means, and a first end of the first precharge means of the first block is coupled with a first end of the third isolation means through a second coupling means.

13. The semiconductor memory device of claim 12, wherein a first end of the second isolation means of the second block is coupled with a second end of the sense amplifier through the first coupling means, and a first end of the second precharge means of the second block is coupled with a first end of the fourth isolation means through the second coupling means.

14. The semiconductor memory device of claim 12, wherein the first coupling means is a polysilicon region, and the second coupling means is an extended active region.

15. The semiconductor memory device of claim 10, wherein the first logic means comprises the first and second isolation means, and the second logic means comprises the third and fourth isolation means.

16. A semiconductor memory device, comprising:

a first isolation transistor connected between a first bitline and a sense amplifier, responding to a first isolation signal;

a second isolation transistor connected between a second complementary bitline in the same row with a first complementary bitline and the sense amplifier, responding to the first isolation signal;

a first precharge transistor connected between the first complementary bitline and reference voltage, responding to the first isolation signal;

a second precharge transistor connected between a second bitline in the same row with the first bitline and the reference voltage, responding to the first isolation signal;

a third isolation transistor connected between the first complementary bitline and the sense amplifier, responding to a second isolation signal;

a fourth isolation transistor connected between the second bitline and the sense amplifier, responding to the second isolation signal;

a third precharge transistor connected between the first bitline and the reference voltage, responding to the second isolation signal; and a fourth precharge transistor connected between the second complementary bitline and the reference voltage, responding to the second isolation signal.

17. A semiconductor memory device, comprising:

an isolation transistor connecting a bitline to a sense amplifier;

a precharge transistor connecting the bitline to a reference voltage;

a conductive line transferring a signal for controlling the isolation and precharge transistors; and wherein the isolation transistor and the precharge transistor comprise respectively a conductive region formed under each side of the conductive line.

18. A semiconductor memory device, comprising:

an isolation transistor connecting a bitline to a sense amplifier;

a precharge transistor connecting the bitline to a reference voltage;

a first block region comprising a first and second conductive lines;

a second block region comprising a third and fourth conductive lines;

said conductive lines having a finite vertical thickness within said semiconductor, said vertical thickness comprising an upper portion and a lower portion;

a sense amplifier;

wherein the first and second conductive lines carry a first and second isolation signals, respectively;

wherein the third and fourth conductive lines carry a first and second isolation signals, respectively;

a first conductive region formed under each side of the first conductive line in the first block region for connecting a first bitline to the sense amplifier;

a second conductive region formed under each side of the second conductive line in the first block region for connecting a first complementary bitline to the sense amplifier;

a third conductive region formed under each side of the second conductive line in the second block region for connecting a second bitline to the sense amplifier;

a fourth conductive region formed under each side of the first conductive line in the second block region for connecting a second complementary bitline to the sense amplifier;

a fifth conductive region formed under each side of the second conductive line in the first block region for connecting the first bitline to the reference voltage;

a sixth conductive region formed under each side of the first conductive line in the first block region for connecting the first complementary bitline to the reference voltage;

a seventh conductive region formed under each side of the first conductive line in the second block region for connecting the second bitline to the reference voltage; and an eighth conductive region formed under each side of the second conductive line in the second block region for connecting the second complimentary bitline to the reference voltage.

* * * * *